Oct. 13, 1970 N. GREGORY 3,534,295

LINEARIZED FREQUENCY MODULATED CRYSTAL OSCILLATORS COMPENSATED FOR AMBIENT TEMPERATURE VARIATIONS

Filed Sept. 5, 1968

INVENTOR
NICHOLAS GREGORY

BY Robert Shaw

ATTORNEY

United States Patent Office
3,534,295
Patented Oct. 13, 1970

3,534,295

LINEARIZED FREQUENCY MODULATED CRYSTAL OSCILLATORS COMPENSATED FOR AMBIENT TEMPERATURE VARIATIONS

Nicholas Gregory, Andover, Mass., assignor to Robert Shaw, Arlington, Mass.

Filed Sept. 5, 1968, Ser. No. 757,650
Int. Cl. H03c 3/22
U.S. Cl. 331—158 3 Claims

ABSTRACT OF THE DISCLOSURE

Crystal oscillator apparatus adapted to be linearly modulated over a wide range of frequencies in response to voltage changes across a first voltage variable capacitance in series with the crystal and to be compensated for variations in ambient temperature in response to voltage changes across a second voltage variable capacitance in series with both the crystal and the first voltage variable capacitance, but isolated from the latter by an impedance element.

Figure 1:
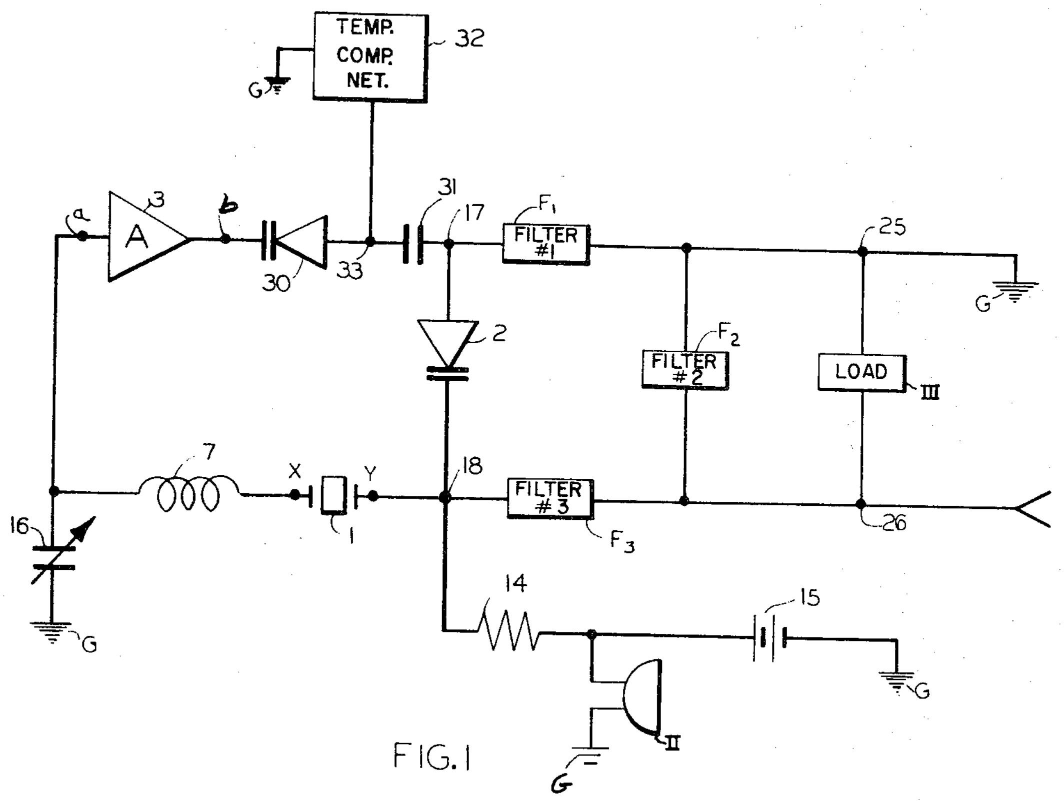

The present invention relates to apparatus adapted to frequency-modulate radio frequency signals and, more particularly, to apparatus embodying crystal means and first and second voltage variable capacitance means in series combination, the first voltage variable capacitance means being adapted to modulate the frequency of the signal and the second voltage variable capacitance being adapted to compensate for variations in the frequency due to changes in the ambient temperature within which the apparatus is located.

In Letters Patent 3,252,108, granted May 17, 1966 to the present inventor, there is described linearized frequency modulated crystal oscillator apparatus. As is noted in said Letters Patent, there are many requirements for a precise radio-frequency signal which can be frequency modulated. This is common in broadcast apparatus and the like, but other uses may be made of such a precise frequency-moduated signal. A crystal is used to maintain the signal frequency substantially constant in the oscillator circuit of such apparatus, the crystal being chosen because of its stable frequency characteristics. This stability, however, makes appreciable linear shifting of frequency difficult in crystal-controlled oscillator circuits.

An equivalent circuit of the crystal of a crystal-controlled oscillator includes a resistance, capacitance and inductance in series and a capacitance in parallel therewith. Frequency-modulation of such an oscillator has been effected by changing the reactance of the oscillatory circuit including the crystal by use, for example, of reactance tubes, variable inductances and/or variable capacitance elements, the result being effected often by either changing the reactance of the elements in the circuit or by changing the effect of such elements. In such instances the Q or quality factor of the crystal is reduced by placing other elements across the crystal, thus making oscillation dependent to some extent upon circuit elements have less stability than the crystal and thus lessening frequency stability.

In the oscillators of the type discussed above, the crystal frequency drifts with changes in the ambient temperature. In presently available apparatus the effect of temperature changes has been lessened by placing the oscillator in an oven wherein the temperature is kept constant irrespective of changes in the surrounding temperature. In other circumstances temperature sensitive impedance devices have been connected into the oscillator circuit. Such devices have temperature impedance characteristics which are opposite to the temperature impedance characteristics of the crystal and other related circuit elements, and by proper matching the effect of temperature is mitigated. These compensation devices can be connected across the voltage variable capacitance discussed in said Letters Patent, but the effect thereof is to decrease the available linearity since the temperature compensation voltage shifts the operating or quiescent point of the voltage variable capacitance from a point which gives maximum linear range for modulation to a point which gives some lesser available range.

An object of the present invention is to provide crystal oscillators similar to the oscillators discussed in said patent but adapted to receive a voltage signal from temperature sensitive means to compensate for ambient temperature changes but without changing the point of operation of the modulating voltage variable capacitance about which the frequency modulation is effected.

Another object is to provide such oscillators with temperature compensation elements connected to the oscillator circuit across a further votage variable capacitance, frequency shifts of the circuit due to variations in temperature being corrected by appropriate voltage bias changes across the further capacitance effected by the compensation elements.

Other objects will be evident in the description to follow and will be particularly pointed out in the appended claims.

The objects of the invention are attained in an electric circuit operable to oscillate over a predetermined frequency range and adapted to be compensated for environmental temperature changes. A crystal is provided to control the frequency of oscillation in said range, the crystal reactance at varying frequency being non-linear and capacitive within said frequency range. An inductance is connected in series with the crystal. A first voltage variable capacitance, connected in series with the crystal, has a reactance which is non-linear at varying reverse-bias voltage and is operable, in combination with the crystal, to vary the frequency of oscillation within said range. Means is provided to apply a quiescent reverse-bias voltage to the voltage variable capacitance, the bias means being operable to establish a quiescent point within said range about which the sum of the reactance of the crystal and the voltage variable capacitance, in combination, is substantially linear over said frequency range. A second voltage variable capacitance is connected in series with the crystal. The second voltage variable capacitance is adapted to receive a D-C voltage to compensate for frequency drift of the circuit due to temperature changes in the environment occupied by the circuit, impedance means being provided to isolate the first voltage variable capacitance from the second voltage variable capacitance.

Figure 2:
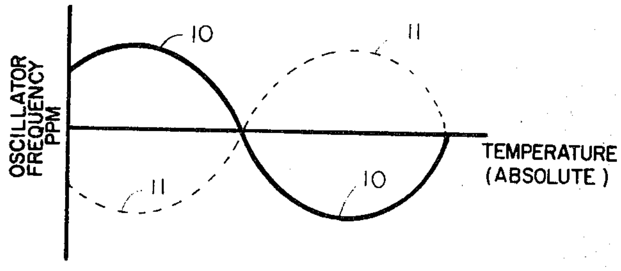

The invention will now be explained in connection with the accompanying drawing in which FIG. 1 is a schematic circuit diagram partially in block diagram form of an embodiment of the present invention; and FIG. 2 is a graph showing typical shifts in crystal oscillator frequency as a function of absolute temperature and shifts in the frequency of such circuits effected by compensating means adapted to offset the shifts in frequency that would occur in the absence of such compensation.

Referring to FIG. 1, an electric circuit or oscillator of the present invention is shown in schematic form having a crystal 1 to control the frequency of oscillation of the circuit. The crystal reactance at varying frequency, as discussed in said Letters Patent, is non-linear within a predetermined frequency range. A first voltage variable capacitance or varactor diode 2, which is operable to vary the frequency of oscillation within the predetermined range, is connected in series with the crystal 1. The first voltage variable capacitance 2 has a reactance which is non-linear at varying reverse-bias voltage, and the crystal 1 is chosen to match the voltage variable capacitance 2 so that linearity is realized. Thus, a properly matched crystal and a voltage variable capacitance connected in series can be adjusted to introduce a substantially linear sum reactance at varying frequency of oscillation and the reactances can be matched to give a sum reactance of better than one percent non-linearity over the frequency range of interest. Means, which may be the battery shown at 15, is provided to apply a quiescent reverse-bias voltage to the voltage variable capacitance 2. The reverse bias so applied is operable to establish a quiescent or operating point on the characteristic curve of the voltage variable capacitance 2 about which the sum of the reactances of the crystal 1 and the voltage variable capacitance 2, acting in combination, is substantially linear within the frequency range of interest, as discussed in said patent.

The voltage variable capacitance 2 alone is voltage sensitive and not frequency sensitive. The reactance of the voltage variable capacitance 2 is non-linear as a function of frequency only when associated with another element, as the crystal 1, which, in the illustrated circuits, effects changes in frequency as a function of the reverse-bias voltage upon the voltage variable capacitance 2. By proper choice of the crystal 1 to match a particular voltage variable capacitance 2, a change in capacitance that may be rendered by a modulator voltage will effect a change in the frequency of oscillation. In a sense, therefore, the reactance of the voltage variable capacitance 2 varies with frequency. Presently used voltage variable capacitances are made to have non-linear characteristic curves in which the capacitance varies either as the square root or the cube root of the reverse-bias voltage. A modulator applied across the non-linear voltage variable capacitance 2 will produce a capacitance change which differs at each point along the reverse-bias curve of the capacitance. By proper choice of crystal 1, the net effect on the crystal-voltage-variable-capacitance combination can be linear since the sum of the reactances of the combination is linear in properly matched combinations.

The circuit just discussed, is, however, sensitive to changes in environmental temperature. For example, frequency modulated (FM) transmitters as may be used in taxicabs or the like may be required to operate in environmental temperatures that range from 20° F. below zero (or lower) to 100° F. above zero (or more) and with allowable shifts of the transmitted frequency of as little as 5 parts per million (p.p.m.). In a crystal oscillator circuit the crystal itself is most sensitive to temperature changes, but other elements of the circuit are also sensitive. It has been the practice to enclose the complete oscillator apparatus in an oven and maintain the temperature within the oven at some predetermined temperature. Such ovens are quite expensive and take up substantial space in equipment, and also require long warm-up periods. The present invention relates to circuitry wherein temperature sensitive electrical devices, as thermistors and the like, are connected into the oscillator circuit to prevent frequency changes that would otherwise occur in the absence of compensation. With reference to FIG. 2, the curve shown at 10 is typical of shifts in frequency that occur as a result of ambient temperature changes in the region occupied by the oscillator in the absence of temperature compensation means. The peak values of the curve 10 typically may be the order of 10 to 40 p.p.m. The curve shown at 11 represents changes in the frequency of the oscillator circuit wrought by a temperature compensator circuit as, for example, the circuit shown in block diagram form at 32 in FIG. 1. Ideally the sum of the curves 10 and 11 is zero and falls along the ordinate in FIG. 2, but, in fact, compensation reduces frequency variations to the order of 1 p.p.m.

If the network 32 were connected to the circuit between point 17 and ground G (ground being used herein to designate chassis or common connection as well as actual earthing), the effect would be to shift the point on the reactance v. frequency curve of the first voltage variable capacitance 2 about which the frequency of the circuit would be shifted by modulation, thus reducing the available linear range for modulation. In the present circuit frequency shifts to compensate for temperature are effected by connecting the temperature compensation network 32 to the oscillator circuit at 33 to the input of a second voltage variable capacitance 30, the second voltage variable capacitance being adapted to receive a D-C voltage from the network 32 and to effect shifts in the oscillator circuit frequency, as represented by the curve 11, to compensate for the frequency shifts represented by the curve 10. A D-C blocking capacitance 31 is connected between the input to the voltage variable capacitance 30 and the voltage variable capacitance 2 to isolate the temperature compensation voltage, thereby to prevent shifts of the quiescent or operating point during compensation.

As is shown in said patent, the crystal reactance is non-linear and capacitive in the frequency range within which modulation is effected, and an inductance 7 is connected in series with the crystal to offset this capacitance as well as the capacitance of the other capacitance elements in the circuit to allow oscillation.

The oscillator is described in the patent with a number of means to furnish modulation. In the present discussion the modulation shown at II is a microphone connected through a resistance 14 to point 18 in the oscillator circuit, but it should be kept in mind that the other forms of modulation discussed in the patent can be applied here, as well.

A more detailed discussion of the circuit operation will now be made with reference to FIG. 1. An amplifier 3 is shown having an input *a* and an output *b*. A feedback path between *a* and *b* includes the voltage variable capacitance 30, which is connected to the output *b* at one terminal thereof and to the D-C voltage isolator capacitance 31 at the other terminal. The capacitance 31 is connected to the input of the voltage variable capacitance 2, which, in turn, is connected to one terminal of the crystal I, shown at Y. The other terminal of the crystal I, shown at X, is connected to the inductance 7 and thence to the input *a*, thus completing the feedback path. A small alternating-current signal appearing, for example, at the input *a* is amplified and shifted in phase by approximately 180 degrees by the amplifier 3. The amplified signal passes from the output *b* through the feedback path wherein the phase is shifted a further 180 degrees for a total 360 degree shift. If the gain in the circuit from the input *a* through the amplifier and feedback path back to *a* is unity or greater and the elements of the circuit are chosen to produce the 360 degree shift of phase, then the circuit will oscillate at a frequency which is controlled by the crystal 1. While the crystal 1 controls the frequency of oscillation, the frequency is, nevertheless, subject to slight modification depending on the crystal. A variable capacitance 16 connected, for example, between the input *a* and ground G may be used to make fine frequency adjustments of the circuit of ±0.005 percent to establish exactly the desired frequency of oscillation. Further shifting of the frequency of oscillation may be effected, as for modulation thereof, by modulating the capacitance of the voltage variable capacitance 2 as previously mentioned.

A radio frequency signal is withdrawn across the voltage variable capacitance 2. The output circuit includes a filter $F_1$ connected at one terminal thereof to the point 17 and at the other terminal to a filter $F_2$ and to ground G. The filter $F_2$ in turn, is connected to a filter $F_3$ which is connected to the point 18, a load III being connected across $F_2$ between points 25 and 26. By proper choice of the filters $F_1$, $F_2$ and $F_3$, the frequency of oscillation or harmonics thereof can be applied to the load III, as discussed in greater detail in said patent.

A typical range of operating temperatures is −40° C. to +100° C. and the frequency shifts necessary to compensate for such temperature are of the order .01 percent whereas modulation shifts, as mentioned in the patent, may be up to the order of ±0.1 to 0.2 percent.

Modifications of the invention herein described, including, but not restricted to, the circuit modifications disclosed in said patent, will occur to those skilled in the art, and all such modifications are considered to fall within the spirit and scope of the invention as defined in the appended claims.

What is claimed is:

1. In an electric circuit operable to oscillate over a predetermined frequency range and adapted to be compensated for environmental temperature changes, a crystal to control the frequency of oscillation in said range, the crystal reactance at varying frequency being non-linear and capacitive within said frequency range, an inductance in series with the crystal, a first voltage variable capacitance in series with the crystal and having a reactance which is non-linear at varying reverse-bias voltage, the voltage variable capacitance being operable in combination with the crystal to vary the frequency of oscillation within said range, means to apply a quiescent reverse-bias voltage to the voltage variable capacitance, the bias means being operable to establish a quiescent point within said range about which the sum of the reactance of the crystal and the voltage variable capacitance in combination is substantially linear over said frequency range, a second voltage variable capacitance in series with the crystal and adapted to receive a D–C voltage to compensate for frequency drift of the circuit due to temperature changes in the environment occupied by the circuit, and impedance means connected to isolate the first voltage variable capacitance from the second voltage variable capacitance.

2. An electric circuit as claimed in claim 1 in which a D–C blocking capacitance is connected between the voltage input to the second voltage variable capacitance and the first voltage variable capacitance.

3. A circuit as claimed in claim 1 having temperature compensation means connected to the input of the second voltage variable capacitance.

References Cited

UNITED STATES PATENTS

| | | | |
|---|---|---|---|
| 3,252,108 | 5/1966 | Gregory | 331—116 |
| 3,428,916 | 2/1969 | Hovenga et al. | 331—116 |

JOHN KOMINSKI, Primary Examiner

U.S. Cl. X.R.

331—176, 177; 332—26, 30; 334—15

UNITED STATES PATENT OFFICE
CERTIFICATE OF CORRECTION

Patent No. 3,534,295 October 13, 1970

Nicholas Gregory

It is certified that error appears in the above identified patent and that said Letters Patent are hereby corrected as shown below:

In the heading to the printed specification, lines 5 and 6, "assignor to Robert Shaw" should read -- assignor of one-fourth to Robert Shaw --.

Signed and sealed this 6th day of April 1971.

(SEAL)
Attest:

EDWARD M.FLETCHER,JR.
Attesting Officer

WILLIAM E. SCHUYLER, JR.
Commissioner of Patents